United States Patent
Lee et al.

(10) Patent No.: US 8,526,288 B2
(45) Date of Patent: Sep. 3, 2013

(54) OPTICAL ELEMENTS INCLUDING LIGHT SOURCES AND WAVEGUIDES AND INFORMATION STORAGE DEVICES INCLUDING THE SAME

(75) Inventors: Sung-chul Lee, Osan-si (KR); Seung-hoon Han, Seoul (KR); In-kyeong Yoo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/297,713

(22) Filed: Nov. 16, 2011

(65) Prior Publication Data
US 2012/0257484 A1     Oct. 11, 2012

(30) Foreign Application Priority Data

Apr. 7, 2011   (KR) .................. 10-2011-0032146

(51) Int. Cl.
*G11B 7/00*   (2006.01)
(52) U.S. Cl.
USPC ..................... 369/112.27; 369/121
(58) Field of Classification Search
None
See application file for complete search history.

(56) References Cited

U.S. PATENT DOCUMENTS

| 6,388,912 B1 | 5/2002 | Hannah et al. | |
| 6,614,742 B2* | 9/2003 | Ueyanagi | 369/118 |
| 8,050,170 B2* | 11/2011 | Park et al. | 369/112.23 |
| 2004/0085861 A1* | 5/2004 | Hamann et al. | 369/13.01 |
| 2009/0106783 A1* | 4/2009 | Miyanishi et al. | 720/658 |
| 2010/0097901 A1* | 4/2010 | Challener et al. | 369/13.35 |
| 2011/0228650 A1* | 9/2011 | Shimazawa et al. | 369/13.24 |

FOREIGN PATENT DOCUMENTS

| JP | 8250331 A | 9/1996 |
| JP | 2002-097099 A | 4/2002 |
| JP | 2008-165933 A | 7/2008 |
| KR | 2004-0034366 A | 4/2004 |

OTHER PUBLICATIONS

Stanciu, C.D. et al., "All-Optical Magnetic Recording with Circularly Polarized Light," The American Physical Society, Jul. 27, 2007, pp. 1-4.
Schuller, J. et al., "Plasmonics for extreme light concentration and manipulation," Nature Materials, vol. 9, Mar. 2010, pp. 193-204.
Challener, W. A. et al., "Heat-assisted magnetic recording by a near-field transducer with efficient optical energy transfer," Nature Photonics, Col. 3, Apr. 2009, pp. 220-224.

\* cited by examiner

*Primary Examiner* — Paul Huber
(74) *Attorney, Agent, or Firm* — Harness, Dickey & Pierce, P.L.C.

(57) ABSTRACT

An optical element and an information storage device including the same. The optical element may include an optical waveguide structure for transforming circularly polarized light into plasmon and transmitting the plasmon. The optical waveguide structure may emit a circularly polarized plasmonic field. The optical element may be used in an information storage device. For example, the information storage device may include a recording medium and a recording element for recording information on the recording medium, and the recording element may include the optical element. The information may be recorded on the recording medium by using the circularly polarized plasmonic field generated by the optical element.

22 Claims, 8 Drawing Sheets

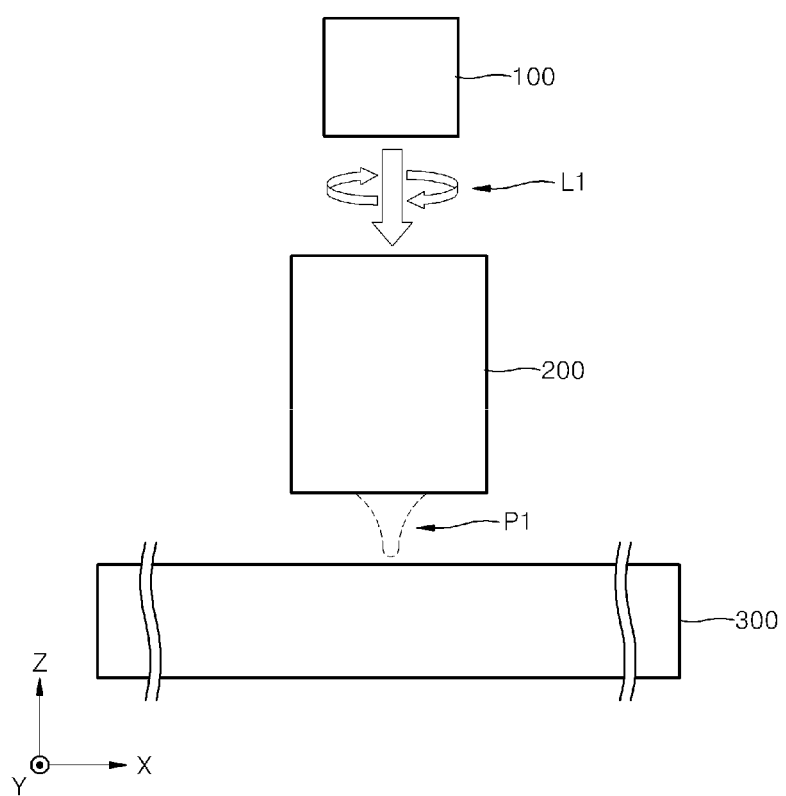

OPTICAL ELEMENTS INCLUDING LIGHT SOURCES AND WAVEGUIDES AND INFORMATION STORAGE DEVICES INCLUDING THE SAME

CROSS-REFERENCE TO RELATED APPLICATIONS

This application claims priority under 35 U.S.C. §119 to Korean Patent Application No. 10-2011-0032146, filed on Apr. 7, 2011, in the Korean Intellectual Property Office, the entire contents of which are incorporated herein in its entirety by reference.

BACKGROUND

1. Field

At lest one example embodiment relates to optical elements and information storage devices including the same.

2. Description of the Related Art

In the field of information storage devices such as magnetic recording devices, research has been continuously conducted to increase recording density. The thermal stability of data recorded on a magnetic recording medium is proportional to a ratio between magnetic anisotropic energy and thermal energy, i.e., $K_U V / k_B T$. Here, $K_U$ represents a magnetic anisotropic energy density of a magnetic recording medium, V represents a volume of a magnetic grain, $k_B$ represents a Boltzmann constant, and T represents an absolute temperature. In order to increase the thermal stability of data, a material having a high magnetic anisotropic energy density $K_U$ should be used to form a recording medium. However, if a material having a high magnetic anisotropic energy density $K_U$ is used, the intensity of a magnetic field required to record data is increased.

According to heat assisted magnetic recording (HAMR), a local portion of a recording medium is heated to temporarily reduce a coercive force of the local portion, and then data is recorded on the heated portion of the recording medium. By heating, the intensity of a magnetic field used to record data may be reduced.

SUMMARY

Provided are optical elements capable of reducing the size of a light spot.

Provided are optical elements capable of generating a strong magnetic field.

Provided are optical elements capable of generating a circularly polarized plasmonic field.

Provided are information storage devices including the optical elements.

Additional aspects will be set forth in part in the description which follows and, in part, will be apparent from the description, or may be learned by practice of example embodiments.

According to an aspect of at least one example embodiment, an optical element includes a light source configured to generate circularly polarized light, and an optical waveguide configured to transform the circularly polarized light generated by the light source into plasmon and emit the plasmon.

The optical waveguide structure may be configured to emit a circularly polarized plasmonic field.

The optical waveguide may include a metal and a dielectric contacting the metal, and the optical waveguide is configured to emit the plasmon from an interface between the metal and the dielectric.

The optical waveguide may include a ring structure.

The ring structure may have a discrete ring structure.

The optical waveguide may include a rod structure.

The rod structure has a groove in a surface of the rod structure. The groove has a spiral shape.

The optical waveguide includes a tapered structure, and a width of the tapered structure decreases toward an emitting portion of the tapered structure.

The tapered structure has a groove in a surface of the tapered structure. The groove has a spiral shape.

According to another aspect of at least one example embodiment, an information storage device includes a recording medium, and a recording element configured to record information on the recording medium. The recording element includes an optical element configured to generate a circularly polarized plasmonic field, the information being recorded on the recording medium by using the circularly polarized plasmonic field.

The recording medium may be a magnetic recording medium.

The recording medium may be a perpendicular recording medium.

A distance between the recording medium and the optical element may be equal to or less than several ten nanometers (nm).

The optical element may include a light source configured to generate circularly polarized light, and an optical waveguide configured to transform the circularly polarized light generated by the light source into plasmon and emit the plasmon. The optical waveguide is configured to emit the circularly polarized plasmonic field.

The optical waveguide structure may include a metal and a dielectric contacting the metal, and the optical waveguide is configured to emit the plasmon from an interface between the metal and the dielectric.

The optical waveguide may include a ring structure.

The ring structure may have a discrete ring structure.

The optical waveguide may include a rod structure.

The rod structure has a groove in a surface of the rod structure.

The optical waveguide includes a tapered structure, and a width of the tapered structure decreases toward an emitting portion of the tapered structure.

The tapered structure has a groove in a surface of the tapered structure.

The recording element may include a plurality of elements configured to record information on the recording medium, and the optical element may be one of the plurality of elements.

The information storage device may further include a reading element configured to read the information recorded on the recording medium.

BRIEF DESCRIPTION OF THE DRAWINGS

These and/or other aspects will become apparent and more readily appreciated from the following description of example embodiments, taken in conjunction with the accompanying drawings of which:

FIG. 1 is a cross-sectional view of an information storage device including an optical element, according to at least one example embodiment;

DETAILED DESCRIPTION

Figure 2A:
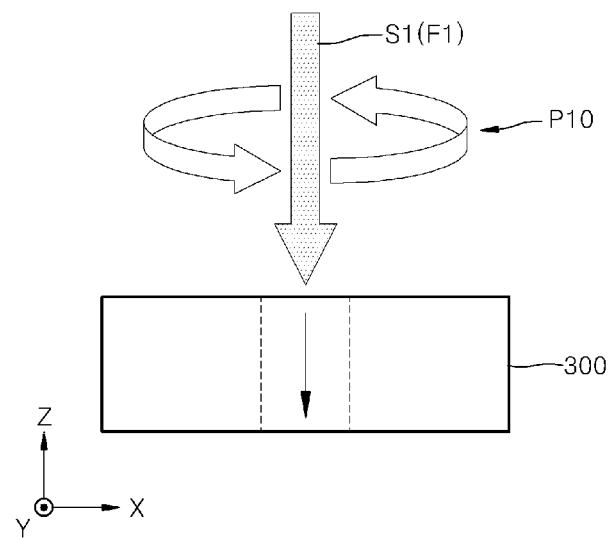
FIGS. 2A and 2B are diagrams for describing a recording mechanism by a circularly polarized plasmonic field generated by the optical element illustrated in FIG. 1, according to at least one example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, changes from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to example embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects of the present description.

FIG. 1 is a cross-sectional view of an information storage device including an optical element, according to at least one example embodiment.

Referring to FIG. 1, the information storage device may include a light source 100 for generating circularly polarized light L1. The light source 100 may include a predetermined or given circular polarization filter. Arbitrary light may be changed into the circularly polarized light L1 by the circular polarization filter. The circularly polarized light L1 may refer to light in which an electric or magnetic field component of a light wave rotates in a direction perpendicular to a proceeding direction of the light wave. If the electric field component vibrates in a clockwise direction, the light is referred to as right-handed circularly polarized light. If the electric field component vibrates in a counterclockwise direction, the light is referred to as left-handed circularly polarized light. In other words, the circularly polarized light L1 may be classified as right-handed or left-handed circularly polarized light according to a vibration (rotation) direction of an electric field component of the circularly polarized light L1.

The information storage device may include an optical waveguide structure 200 for transmitting the circularly polarized light L1 generated by the light source 100. For convenience's sake, the optical waveguide structure 200 is illustrated simply. The detailed structure of the optical waveguide structure 200 will be described later with reference to FIGS. 3 through 8. The optical waveguide structure 200 may transform the circularly polarized light L1 into plasmon and transmit the plasmon. Here, the plasmon may be surface plasmon. For example, the optical waveguide structure 200 may include a metal and a dielectric contacting each other, and the plasmon may be transmitted via an interface between the metal and the dielectric. The plasmon may be generated due to a resonance phenomenon caused by vibrations of light and electrons on the interface between the metal and the dielectric, and may proceed along the interface. The optical waveguide structure 200 may transmit the plasmon, and may emit a circularly polarized plasmonic field P1 from an emitting portion (a lower surface of the optical waveguide structure 200 in FIG. 1). The circularly polarized plasmonic field P1 is a sort of optical field, and may refer to a circularly polarized plasmonic ray. The circularly polarized plasmonic field P1 may be maintained in a region adjacent to the optical waveguide structure 200.

A recording medium 300 may be disposed under the optical waveguide structure 200. The recording medium 300 may be a magnetic recording medium. Also, the recording medium 300 may be a perpendicular recording medium. For example, the recording medium 300 may be a perpendicular magnetic recording medium. Predetermined information may be recorded on the recording medium 300 by using the circularly polarized plasmonic field P1 emitted from the optical waveguide structure 200. In a recording operation, the distance between the optical waveguide structure 200 and the recording medium 300 may be equal to or less than several hundred nanometers (nm). For example, in a recording operation, the distance between the optical waveguide structure 200 and the recording medium 300 may be equal to or less than several ten nm. Since the circularly polarized plasmonic field P1 generated by the optical waveguide structure 200 may be maintained in a region adjacent to the optical waveguide structure 200, in a recording operation, the recording medium 300 may be disposed adjacent to the optical waveguide structure 200.

Since the circularly polarized plasmonic field P1 is a sort of plasmonic ray, due to characteristics of plasmon, the circularly polarized plasmonic field P1 may have a short wavelength $\lambda$. Accordingly, if the circularly polarized plasmonic field P1 is used, a light spot having a very small size capable of overcoming a diffraction limit may be realized. For example, a light spot formed by the circularly polarized plasmonic field P1 may have a size (diameter) equal to or less than about 10 nm.

Also, as circularly polarized light, the circularly polarized plasmonic field P1 may generate a strong magnetic field (recording magnetic field). For example, if light of about 3 mJ/cm$^2$ is used, a strong magnetic field (recording magnetic field) of about 6 tesla (T) may be generated. The magnetic field may be energy directly used to record information on the recording medium 300. In more detail, since the circularly polarized plasmonic field P1 is circularly polarized light, the circularly polarized plasmonic field P1 may generate a magnetic field parallel with a proceeding direction of the circularly polarized plasmonic field P1, i.e., perpendicular to the recording medium 300. The direction of the magnetic field may differ according to a rotation (vibration) direction of an electric field component of the circularly polarized plasmonic field P1. For example, the magnetic field may be applied in an inverse direction of a Z axis direction if the rotation (vibration) direction is left, and may be applied in the Z axis direction if the rotation (vibration) direction is right. According to the direction in which the magnetic field is applied, information (data) recorded on the recording medium 300 may differ. That is, information (data) '0' may be recorded on the recording medium 300 if the magnetic field is applied in the inverse direction of the Z axis direction, and information (data) '1' may be recorded on the recording medium 300 if the magnetic field is applied in the Z axis direction. Since the direction of the magnetic field is determined according to the rotation (vibration) direction of the electric field component of the circularly polarized plasmonic field P1, the information (data) recorded on the recording medium 300 may be controlled by controlling the rotation (vibration) direction of the electric field component.

A direction of the magnetic field generated by the circularly polarized plasmonic field P1, and a recording mechanism by the magnetic field are now described in detail with reference to FIGS. 2A and 2B. In FIG. 2A, circularly polarized plasmonic field P10 proceeds in an inverse direction of a Z axis direction, i.e., a direction toward the recording medium 300.

Referring to FIG. 2A, if the circularly polarized plasmonic field P10 is left-handed circularly polarized light, a spin momentum 51 due to the circularly polarized plasmonic field P10 may be generated in the inverse direction of the Z axis direction. A direction of the spin momentum 51 may be the same as the direction of an effective magnetic field F1 with respect to the recording medium 300. Accordingly, the effective magnetic field F1 may be applied to the recording medium 300 in the inverse direction of the Z axis direction. As such, a local region of the recording medium 300 may be magnetized in the inverse direction of the Z axis direction. This may be regarded as that information (data) '0' is recorded on the local region of the recording medium 300.

Figure 2B:
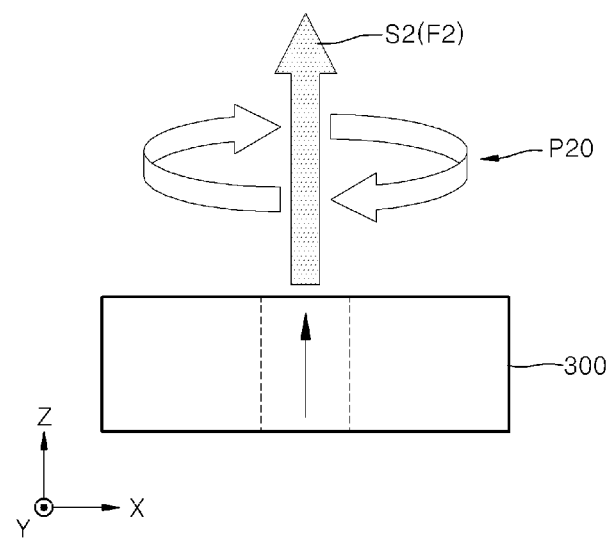

Referring to FIG. 2B, if the circularly polarized plasmonic field P20 is right-handed circularly polarized light, a spin momentum S2 due to the circularly polarized plasmonic field P20 may be generated in the Z axis direction. Accordingly, an effective magnetic field F2 may be applied to the recording medium 300 in the Z axis direction. As such, a local region of the recording medium 300 may be magnetized in the Z axis direction. This may be regarded as that information (data) '1' is recorded on the local region of the recording medium 300.

A magnetic field (recording magnetic field) generated by the circularly polarized plasmonic field P1, P10, or P20 may have a very high intensity. As described above, if light of about 3 mJ/cm$^2$ is used, a strong magnetic field of about 6 tesla (T) may be generated. Accordingly, if the circularly polarized plasmonic field P1, P10, or P20 is used, a local region of the recording medium 300 may be easily magnetized. In other words, if the circularly polarized plasmonic field P1, P10, or P20 is used, writability with regard to the recording medium 300 may be improved. Therefore, although a material having high magnetic anisotropic energy (i.e., a high $K_U$ material) (e.g., FePt in an $L1_0$ structure) is used to form the recording medium 300, a recording operation may be easily performed on the recording medium 300. Furthermore, as described above, if the circularly polarized plasmonic field P1, P10, or P20 is used, a high resolution under a diffraction limit may be obtained since a light spot having a small size is formed. This means that a recording density may be greatly increased. Therefore, according to at least one example embodiment, a recording density and a recording performance of an information storage device may be greatly increased by using extreme light concentration equal to or less than about 10 nm and a strong recording magnetic field.

FIGS. 3 through 8 are perspective views of information storage devices including various optical waveguide structures 200A, 200A', 200B, 200B', 200C, and 200C', according to at least some example embodiments. In FIGS. 3 through 8, the light source 100 and the recording medium 300 are the same as those illustrated in FIG. 1, and thus the optical waveguide structures 200A, 200A', 200B, 200B', 200C, and 200C' will be mainly described.

Figure 3:
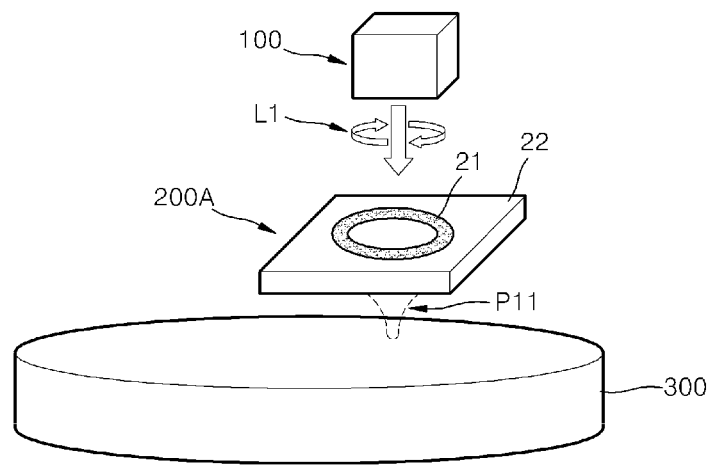
FIGS. 3 through 8 are perspective views of information storage devices including various optical waveguide structures, according to at least some example embodiments.

Referring to FIG. 3, the optical waveguide structure 200A may include a ring type structure 21. The ring type structure 21 may be included in a predetermined material layer (hereinafter referred to as a first material layer 22). Upper and lower surfaces of the ring type structure 21 may be exposed without being covered by the first material layer 22. The ring type structure 21 may be formed of metal, and the first material layer 22 may be formed of a dielectric material. Alternatively, the ring type structure 21 may be formed of a dielectric material, and the first material layer 22 may be formed of metal. Accordingly, an interface between the ring type structure 21 and the first material layer 22 may be an interface between a metal and a dielectric. Plasmon may be generated on the interface between the ring type structure 21 and the first material layer 22 and transmitted via the interface. A circularly polarized plasmonic field P11 may be emitted downwardly from the ring type structure 21. A central portion of the circularly polarized plasmonic field P11 may correspond to the central portion of the ring type structure 21. Predetermined information may be recorded on the recording medium 300 by the circularly polarized plasmonic field P11.

In FIG. 3, the first material layer 22 may not be provided. In this case, the ring type structure 21 may contact air. Since air is a sort of dielectric layer, air may function similarly to the first material layer 22.

Figure 4:
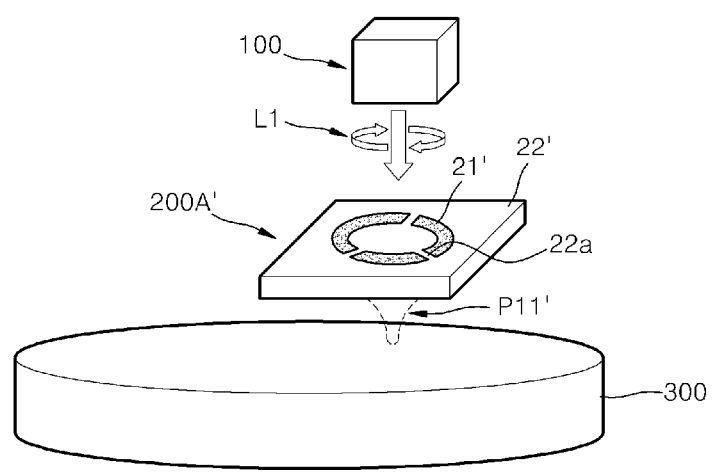

Referring to FIG. 4, the optical waveguide structure 200A' may include a discrete ring type structure 21' in which portions of a ring are cut. A first material layer 22' may be similar to the first material layer 22 illustrated in FIG. 3. However, in FIG. 3, portions of the first material layer 22 inside and outside the ring type structure 21 are completely separate from each other, but, in FIG. 4, portions of the first material layer 22' inside and outside the discrete ring type structure 21' may be connected by at least one connection portion 22a. A plurality of connection portions 22a may be provided. In this case, the plurality of connection portions 22a may be aligned at equal intervals. Although three connection portions 22a are aligned at equal intervals in FIG. 4, the current example embodiment is not limited thereto and the number, shape, size, and alignment of the connection portions 22a may be changed. The connection portions 22a may be formed of the same material as the first material layer 22'. A circularly polarized plasmonic field P11' may be emitted downwardly from the discrete ring type structure 21', and thus predetermined information may be recorded on the recording medium 300.

If the information storage device includes the discrete ring type structure 21' as illustrated in FIG. 4, light distribution and polarization characteristics of the circularly polarized plasmonic field P11' may differ from those of the circularly polarized plasmonic field P11 illustrated in FIG. 3. By adjusting the shape (structure) of the discrete ring type structure 21', the light distribution and polarization characteristics of the circularly polarized plasmonic field P11' may be adjusted. Accordingly, the circularly polarized plasmonic field P11' may have light distribution and polarization characteristics.

Figure 5:
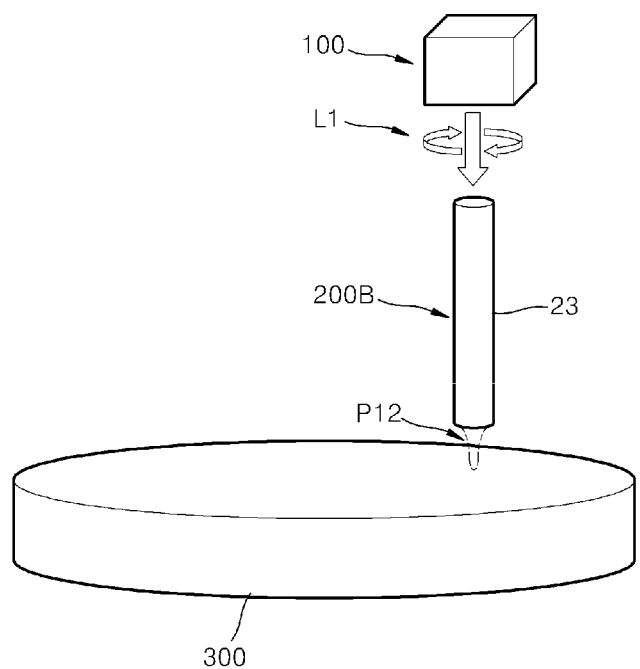

Referring to FIG. 5, the optical waveguide structure 200B may include a rod type structure 23. The rod type structure 23 may be perpendicular to the recording medium 300. The rod type structure 23 may be a metal rod. In this case, although not shown in FIG. 5, a dielectric material layer may surround the rod type structure 23. Alternatively, the dielectric material layer may not be formed. If the dielectric material layer is not formed, the rod type structure 23 may contact air and, since air is a sort of dielectric material, air may function similarly to the dielectric material layer. If the dielectric material layer is formed, materials for forming the rod type structure 23 and the dielectric material layer may be switched. In some cases, the rod type structure 23 may have a core-shell structure including a core portion and a shell portion. The core portion may be formed of metal, and the shell portion may be formed of a dielectric, or vice versa. A circularly polarized plasmonic field P12 may be emitted downwardly from the rod type structure 23. A central portion of the circularly polarized plasmonic field P12 may correspond to the central portion of the lower surface of the rod type structure 23. Predetermined information may be recorded on the recording medium 300 by the circularly polarized plasmonic field P12.

Figure 6:
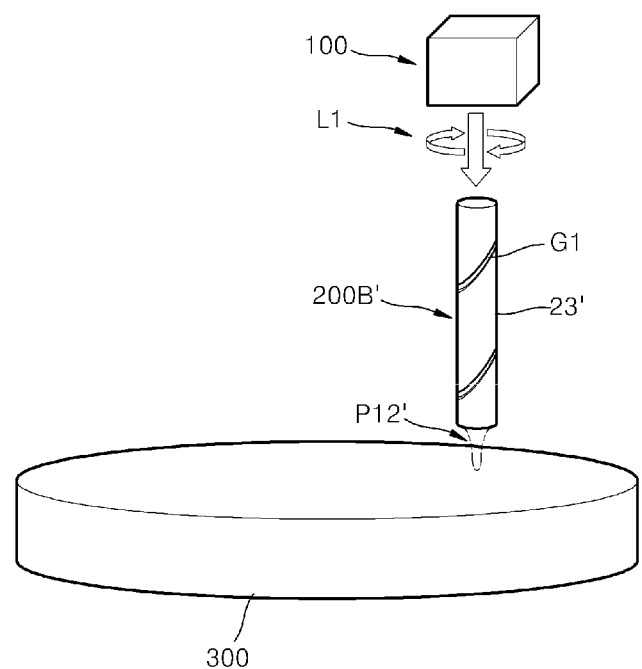

Referring to FIG. 6, the optical waveguide structure 200B' may include a rod type structure 23' having a surface in which a predetermined groove G1 is formed. The groove G1 may have, for example, a spiral shape. However, the shape/structure of the groove G1 is an example and may be changed. The groove G1 may change diffraction characteristics of plasmon transmitted via the optical waveguide structure 200B', and thus may change light distribution and polarization characteristics of a circularly polarized plasmonic field P12' emitted from the rod type structure 23'. The light distribution and polarization characteristics of the circularly polarized plasmonic field P12' may differ according to the shape/structure of the groove G1. By adjusting the shape/structure of the groove G1, the light distribution and polarization characteristics of the circularly polarized plasmonic field P12' may be adjusted. Although the groove G1 is used here, another structure similar to the groove G1 may also be used.

Figure 7:
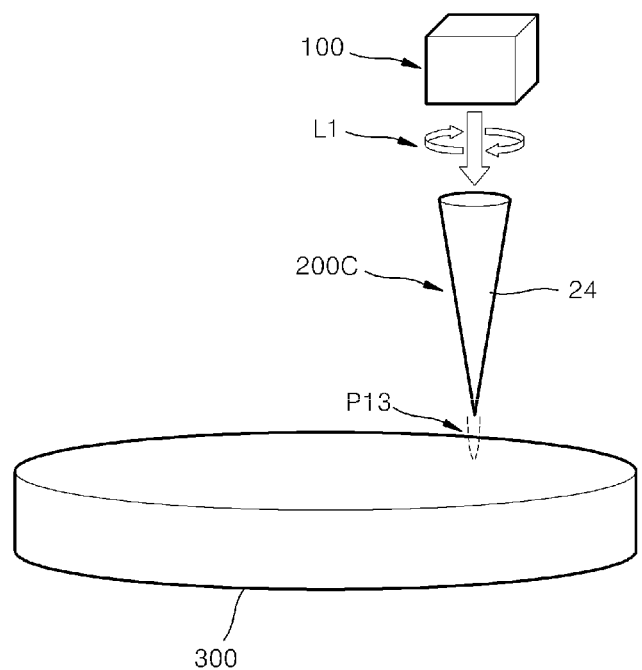

Referring to FIG. 7, the optical waveguide structure 200C may have a taper type structure 24 that is narrowed downward. The taper type structure 24 may have a gradually decreasing width. In this case, plasmon energy may be maintained without loss while being transmitted via the taper type structure 24. The taper type structure 24 may be modified from the rod type structure 23 illustrated in FIG. 5. Accordingly, the taper type structure 24 may be formed of a similar material and may have a similar ambient material to the rod type structure 23. Since the taper type structure 24 has a gradually decreasing width downward, the size of a circularly polarized plasmonic field P13 emitted from the taper type structure 24 (i.e., the size of a light spot) may be smaller than that of FIGS. 5 and 6. Accordingly, if the optical waveguide structure 200C is used, a recording density may be further increased. The taper type structure 24 has a cone shape in FIG. 7. However, the shape of the taper type structure 24 is an example and may be changed. For example, the taper type structure 24 may have various shapes such as a triangular pyramid and a rice-grain.

Figure 8:
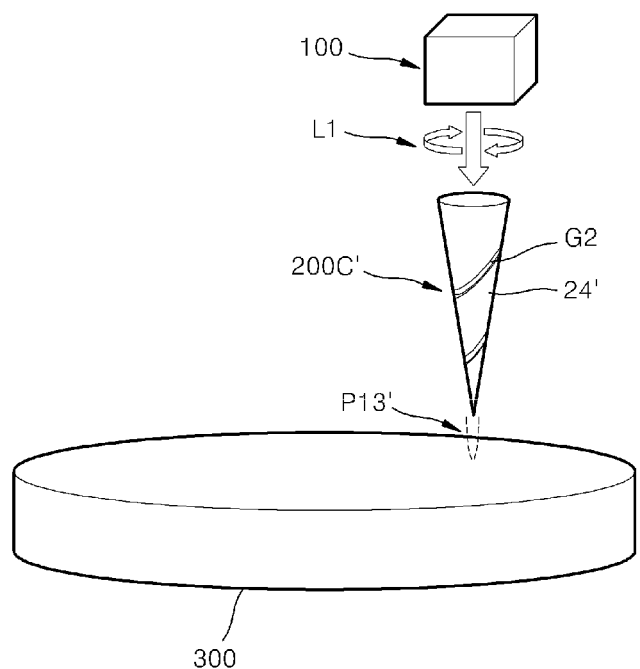

Referring to FIG. 8, the optical waveguide structure 200C' may include a taper type structure 24' having a surface in which a groove G2 is formed. The groove G2 may have a spiral shape like the groove G1 illustrated in FIG. 6, and may function similarly to the groove G1. Accordingly, by adjusting the shape/structure of the groove G2, light distribution and polarization characteristics of a circularly polarized plasmonic field P13' may be adjusted. Another structure similar to the groove G2 may also be used.

Figure 9:
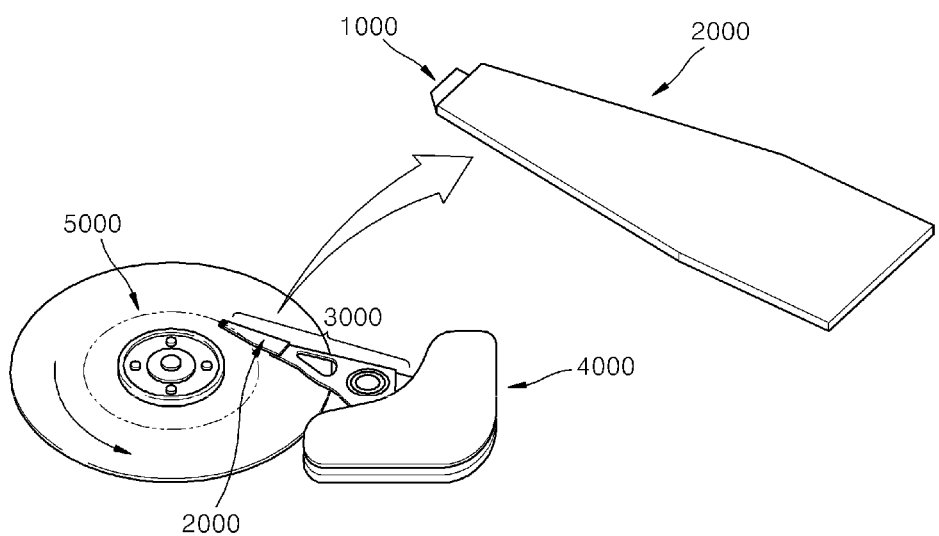
FIG. 9 is a perspective view showing an example of the entire structure of an information storage device including an optical element, according to at least one example embodiment.

FIG. 9 is a perspective view showing an example of the entire structure of an information storage device including an optical element, according to at least one example embodiment.

Referring to FIG. 9, the information storage device may include a recording medium 5000 having a predetermined recording layer, and a head unit 1000 for recording information on the recording medium 5000. The recording medium 5000 may be a rotatable disc type, and the head unit 1000 may be bonded to an end of a suspension 2000 of a swing arm 3000 and may rotate above a surface of the recording medium 5000. In this case, the distance between the head unit 1000 and the recording medium 5000 may be equal to or less than several hundred nm, e.g., several ten nm. The information storage device may further include a voice coil motor (VCM) 4000 for rotating the swing arm 3000.

In FIG. 9, the head unit 1000 may include a recording element. The recording element may include the light source 100 and the optical waveguide structure 200, 200A, 200A', 200B, 200B', 200C, or 200C' described above in relation to FIGS. 1 through 8. Predetermined information may be recorded on the recording medium 5000 by using the circularly polarized plasmonic field P1, P10, P20, P11, P11', P12, P12', P13, or P13' generated by the optical waveguide structure 200, 200A, 200A', 200B, 200B', 200C, or 200C'. In addition, the head unit 1000 may further include a reading element (not shown) for reading the information recorded on the recording medium 5000. The reading element is well known and thus is not described in detail here.

Also, the head unit 1000 may include an optical element including the light source 100 and the optical waveguide structure 200, 200A, 200A', 200B, 200B', 200C, or 200C', as an auxiliary element (i.e., an assistant element). For example, the head unit 1000 may include a plurality of elements for recording information, and one of the elements may be the optical element. For example, the head unit 1000 may be a device in which the optical element is added to an existing magnetic recording head. In this case, the circularly polarized plasmonic field P1, P10, P20, P11, P11', P12, P12', P13, or P13' generated by the optical waveguide structure 200, 200A, 200A', 200B, 200B', 200C, or 200C' may be used as an additional or extra recording magnetic field. The existing magnetic recording head may be a general-structured head or a heat assisted magnetic recording (HAMR)-type head. The existing magnetic recording head is well known and thus is not described in detail here.

As described above, according to one or more of the above example embodiments, an optical element capable of reducing the size of an emitted light spot. The optical element may generate a strong magnetic field in a vertical direction. If the optical element is used in a recording element of an information storage device, a recording density and a recording performance may be greatly improved, and a high-density and high-performance information storage device may be obtained.

It should be understood that example embodiments described therein should be considered in a descriptive sense only and not for purposes of limitation. For example, it would be understood by one of ordinary skill in the art that an optical element and an information storage device according to at least one example embodiment may be changed. Also, it would be understood that the optical element may be used as a magnetic field generating element for recording information magnetically, and other various elements. For example, the optical element may be used as a heating element. Also, the optical element may be used in an information storage device and other devices. Descriptions of features or aspects within each example embodiment should typically be considered as available for other similar features or aspects in other example embodiments.

What is claimed is:

1. An optical element comprising:
a light source configured to generate circularly polarized light; and
an optical waveguide configured to transform the circularly polarized light generated by the light source into plasmon and emit the plasmon, wherein the optical waveguide includes a rod structure and the rod structure has a groove in a surface of the rod structure.

2. The optical element of claim 1, wherein the optical waveguide is configured to emit a circularly polarized plasmonic field.

3. The optical element of claim 1, wherein
the optical waveguide comprises a metal and a dielectric contacting the metal, and
the optical waveguide is configured to emit the plasmon from an interface between the metal and the dielectric.

4. The optical element of claim 1, wherein the groove has a spiral shape.

5. An optical element comprising:
a light source configured to generate circularly polarized light; and
an optical waveguide configured to transform the circularly polarized light generated by the light source into plasmon and emit the plasmon, wherein the optical waveguide includes a tapered structure, a width of the tapered structure decreases toward an emitting portion of the tapered structure and the tapered structure has a groove in a surface of the tapered structure.

6. The optical element of claim 5, wherein the groove has a spiral shape.

7. The optical element of claim 5, wherein the optical waveguide is configured to emit a circularly polarized plasmonic field.

8. The optical element of claim 5, wherein
the optical waveguide comprises a metal and a dielectric contacting the metal, and
the optical waveguide is configured to emit the plasmon from an interface between the metal and the dielectric.

9. An information storage device comprising:
a recording medium; and
a recording element configured to record information on the recording medium, wherein the recording element includes,
an optical element configured to generate a circularly polarized plasmonic field, the information being recorded on the recording medium by using the circularly polarized plasmonic field, the optical element including,
a light source configured to generate circularly polarized light, and
an optical waveguide configured to transform the circularly polarized light generated by the light source into plasmon and emit the plasmon, the optical waveguide being configured to emit the circularly polarized plasmonic field, wherein the optical waveguide includes a rod structure and the rod structure has a groove in a surface of the rod structure.

10. The information storage device of claim 9, wherein the recording medium is a magnetic recording medium.

11. The information storage device of claim 9, wherein the recording medium is a perpendicular recording medium.

12. The information storage device of claim 9, wherein a distance between the recording medium and the optical element is equal to or less than several ten nanometers (nm).

13. The information storage device of claim 9, wherein
the optical waveguide comprises a metal and a dielectric contacting the metal, and
the optical waveguide is configured to emit the plasmon from an interface between the metal and the dielectric.

14. The information storage device of claim 9, wherein
the recording element comprises a plurality of elements configured to record information on the recording medium, and
the optical element is one of the plurality of elements.

15. The information storage device of claim 9, further comprising:
a reading element configured to read the information recorded on the recording medium.

16. An information storage device comprising:
a recording medium; and
a recording element configured to record information on the recording medium, wherein the recording element includes,
an optical element configured to generate a circularly polarized plasmonic field, the information being recorded on the recording medium by using the circularly polarized plasmonic field, the optical element including,
  a light source configured to generate circularly polarized light, and
  an optical waveguide configured to transform the circularly polarized light generated by the light source into plasmon and emit the plasmon, the optical waveguide being configured to emit the circularly polarized plasmonic field, wherein the optical waveguide includes a tapered structure, a width of the tapered structure decreases toward an emitting portion of the tapered structure and the tapered structure has a groove in a surface of the tapered structure.

17. The information storage device of claim 16, wherein the recording medium is a magnetic recording medium.

18. The information storage device of claim 16, wherein the recording medium is a perpendicular recording medium.

19. The information storage device of claim 16, wherein a distance between the recording medium and the optical element is equal to or less than several ten nanometers (nm).

20. The information storage device of claim 16, wherein
the optical waveguide comprises a metal and a dielectric contacting the metal, and
the optical waveguide is configured to emit the plasmon from an interface between the metal and the dielectric.

21. The information storage device of claim 16, wherein
the recording element comprises a plurality of elements configured to record information on the recording medium, and
the optical element is one of the plurality of elements.

22. The information storage device of claim 16, further comprising:
a reading element configured to read the information recorded on the recording medium.

* * * * *